Dec. 1, 1970 W. L. PRICE ET AL 3,544,863

MONOLITHIC INTEGRATED CIRCUIT SUBSTRUCTURE WITH EPITAXIAL DECOUPLING CAPACITANCE

Filed Oct. 29, 1968

INVENTORS
WILLIAM L. PRICE
DON M. JACKSON, JR.

BY

Mueller, Aichele & Rauner

ATTORNEYS

United States Patent Office 3,544,863
Patented Dec. 1, 1970

3,544,863

MONOLITHIC INTEGRATED CIRCUIT SUBSTRUCTURE WITH EPITAXIAL DECOUPLING CAPACITANCE

William L. Price and Don M. Jackson, Jr., Scottsdale, Ariz., assignors to Motorola, Inc., Franklin Park, Ill., a corporation of Illinois Filed Oct. 29, 1968, Ser. No. 771,449
Int. Cl. H01l 7/36, 7/44, 19/00
U.S. Cl. 317—235 6 Claims

ABSTRACT OF THE DISCLOSURE

A monolithic silicon substructure, for use in the fabrication of an integrated circuit having high component density, is constructed to provide a voltage distribution system having increased capacitive decoupling, reduced collar resistance, and reduced collector substrate capacitance. The increased decoupling capacitance is provided by the growth of an epitaxial step junction, beginning with a phosphorus-doped silicon substrate of 0.001 to 0.003 ohm-centimeter resistivity. A first epitaxial silicon layer doped with arsenic or antimony to provide a resistivity of slightly less than 0.01 ohm-centimeter is grown upon the substrate, followed by the growth of a second epitaxial silicon layer doped with boron, for example, to provide a resistivity on the order of 0.01 ohm-centimeter, thereby producing an extremely abrupt step junction to provide high-capacitive decoupling between power and ground levels of the voltage distribution system. Third and fourth epitaxial layers are then grown, in combination with various selective diffusion steps, to provide PN-junction isolation of a portion of the fourth epi layer wherein a circuit component or components are to be fabricated, and to provide a low series resistance path from the substrate to the upper surface of the completed structure.

BACKGROUND OF THE INVENTION

This invention relates to the fabrication of a monolithic silicon substructure to serve as a voltage distribution system for an integrated circuit; and, more particularly, to the fabrication of a hyperabrupt step junction to provide capacitive decoupling between the silicon layers of opposite conductivity type which serve as opposite poles of the voltage distribution system.

The effective distribution of power and ground to a multiplicity of locations throughout a monolithic array of integrated circuit components has proved to be a challenging problem, particularly in the design of large scale integration characterized by high component density. One successful approach to the problem has been to provide a monolithic substructure having adjacent semiconductor layers used exclusively for the distribution of supply voltages, in combination with surface layers wherein the various circuit components are fabricated. In such a structure it is essential to provide compatible electric coupling between the various layers of the structure.

For example, the layer used to distribute power must be separated from a ground layer by a high capacitance decoupling capacitor. Conversely, adjacent active components of the surface layers must be provided with a negligible capacitive coupling, to prevent leakage currents at high frequency operation. Still further, a plurality of low series resistance paths must be provided from the substructure to the upper surface for connection with appropriate circuit components.

It has been known to provide capacitive decoupling in such a substructure by growing a low resistivity boron-doped epitaxial layer directly upon a substrate heavily doped with arsenic. The capacitance of such a junction has not been sufficient to satisfy the requirements of many circuit designs. Moreover, the series resistance of such a substrate is undesirably high since the minimum resistivity achievable in arsenic-doped crystals of suitable structural perfection is no less than 0.005 ohm-centimeter.

Doping with phosphorus has been considered as an alternative to arsenic because its solubility limit is much greater, sufficient to provide resistivities nearly an order of magnitude lower than arsenic. Unfortunately, however, the diffusivity of phosphorus in silicon is very much greater than the diffusivity of arsenic. As a result, the attempt to provide an abrupt step junction by epitaxially growing a heavily boron-doped layer on a phosphorus-doped substrate has failed due to excessive grading of the impurity profile in the epitaxial layer by out-diffusion from the phosphorus-doped substrate, which causes the P-N junction to be formed at a lower boron concentration and thereby limits the capacitance to a level below that which has been achieved with arsenic-doped substrates.

THE INVENTION

It is a primary object of the invention to provide an improved integrated circuit structure, including a monolithic substructure for the transmission and distribution of power supply voltages. More specifically, it is an object of the invention to increase the circuit speed capability of a monolithic integrated circuit by providing increased decupling capacitance between the power and ground levels of an integrated circuit substructure used for the distribution of power supply voltages.

It is a further object of the invention to provide a monolithic integrated circuit substructure having reduced collar resistance, thereby providing a further increase in the circuit speed capability of the completed device.

It is a further object of the invention to increase the frequency response of individual components in an integrated circuit structure by reducing the capacitance between collector and substrate regions.

A primary feature of the invention lies in the combination of an integrated circuit substructure having a substrate resistivity of less than 0.005 ohm-centimeter electrically decoupled from intermediate substructure layers by a hyperabrupt step junction having a capacitance of at least .050 microfarad/cm.$^2$ at $-4$ v. bias. A more specific feature of the invention lies in the combination of a monolithic integrated circuit substructure having a collar region of less than 0.01 ohm-centimeter resistivity, a collector-substrate capacitance of less than .006 microfarad/cm.$^2$, and a substrate having less than 0.005 ohm-centimeter resistivity electrically decoupled from intermediate substructure levels by a step junction having a capacitance of at least .05 microfarad/cm.$^2$ when biased with $-4$ v.

A primary feature of the process embodiments of the invention lies in the step of providing a monocrystalline substrate doped with a first impurity of one conductivity type to provide a substrate resistivity of less than 0.005 ohm-centimeter, followed by the step of growing thereon a first epitaxial silicon layer of the same conductivity type having a thickness of at least 10 microns, doped with a second impurity having a substantially lower diffusivity in silicon than the diffusivity of said first impurity. For example, a substrate heavily doped with phosphorus to provide a resistivity as low as 0.001 ohm-centimeter is provided with an epitaxial buffer layer doped with arsenic or antimony to provide a resistivity no greater than 0.01 ohm-centimeter. Because of its substantially lower diffusivity in silicon, the arsenic or antimony in the epitaxial layer remains relatively immobile during subsequent growth of a second epitaxial layer of the opposite conductivity type, to form a step junction of exceptional abruptness, thereby providing maximum capacitance. If it were attempted to form an abrupt step junction by growing a first epitaxial layer of opposite conductivity type on a substrate having heavy phosphorus doping, out-diffusion of phosphorus from the substrate during epitaxial growth and subsequent processing would severely "grade" the junction.

The invention is embodied in a monolithic silicon substructure for use in the fabrication of an integrated circuit, comprising a monocrystalline silicon substrate plus four successive epitaxial layers thereon of critical resistivities and conductivity types. The structure includes a low resistance path extending completely through the thickness thereof provided by means of a heavily diffusion-doped region of the same conductivity type as the substrate, extending completely through all epitaxial layers except the first layer adjacent the substrate. In addition, a diffused channel region is provided which extends through the fourth epitaxial layer and into the third epitaxial layer, completely surrounding a portion of the fourth epitaxial layer wherein one or more components of the ultimate circuit are to be formed.

The substrate is preferably doped with phosphorus to provide a resistivity in the range of 0.001 to 0.003 ohm-centimeter. A substrate thickness of about 10 mils is typical but not critical. The crystallographic orientation of the substrate must be suitable for the nucleation and growth of epitaxial layers. A (100) orientation, for example, is suitable. The first epitaxial layer is preferably doped with arsenic or antimony to provide a resistivity of less than 0.01 ohm-centimeter and a thickness of 8 to 15 microns, or more if desired.

The second epitaxial layer is grown to a thickness of 1 to 3 microns, and is preferably doped with boron to provide a resistivity on the order of 0.01 ohm-centimeter.

The third epitaxial layer is grown to a thickness of 8 to 15 microns and is preferably doped with boron to a resistivity of about 10 ohm-centimeters.

The final epitaxial layer is grown to a thickness of at least one micron up to a thickness of five microns, and is doped with phosphorus or arsenic to a resistivity of about 0.1 to 2.0 ohm-centimeters.

The low resistivity collar region is formed by the selective diffusion of phosphorus, for example, into the second and third epitaxial layers, respectively, the geometry of both diffusion patterns being the same, in order to provide superimposed regions which spread vertically and merge with each other during processing to form a continuous vertical path of low resistivity.

Similarly, after the third, and again after the fourth, epitaxial layer has been formed, a selective diffusion of boron, for example, is employed to form a channel region which surrounds the critical area wherein device components are to be fabricated. Here, again, a superimposed geometry of diffusion patterns, combined with out-diffusion during the growth of the final epitaxial layer, results in the merging of the diffused regions to form the necessary isolation of the active or "working" region of the wafer surface.

The invention is further embodied in a method for the construction of a monolithic silicon substructure for use in the fabrication of an integrated circuit having a high density of active circuit components, beginning with the step of providing a monocrystalline silicon substrate doped with a first impurity of one conductivity type to provide a substrate resistivity of less than 0.005 ohm-centimeter, followed by the step of growing a first epitaxial silicon layer thereon of the same conductivity type having a thickness of at least 8 microns and doped with a second impurity having a substantially lower diffusivity in silicon than the diffusivity of said first impurity. The ratio of the diffusivity of the first impurity to the diffusivity of the second impurity is at least 3:1, and preferably at least about 10:1.

Thereafter, a second epitaxial silicon layer at least 1 micron thick is grown on said first epitaxial layer, said second layer being doped with a third impurity during growth to provide a conductivity type opposite that of said substrate and said first epi layer, and to provide a resistivity of less than 0.05 ohm-centimeter. After completion of the second epitaxial layer, an impurity is selectively diffused into a portion thereof to form a first low-resistivity diffused region of said one conductivity type having a resistivity of less than 0.008 ohm-centimeter.

A third epitaxial silicon layer of at least 8 microns thickness is then grown on said second layer, said third layer being doped during growth to provide the same conductivity type as the second epitaxial layer and to provide a substantially greater resistivity than the resistivity of the second layer. An impurity is then selectively diffused into the third epitaxial layer to form a second low resistivity diffused region of said one conductivity type having a resistivity of less than 0.008 ohm-centimeter and having substantially the same geometric pattern as the first selectively diffused region formed in the second epitaxial layer. An impurity of said one conductivity type having a lower diffusivity may be selectively diffused into a separate portion of the third epitaxial layer to act as a buried layer for the device to be subsequently fabricated; this diffused area is surrounded by a portion of the third epitaxial layer. An impurity of opposite conductivity type is selectively diffused into a separate portion of said third epitaxial layer to form a diffused region of opposite conductivity type surrounding a portion of said third epitaxial layer.

A fourth epitaxial layer of at least 1 micron thickness is then grown on said third epitaxial layer, said fourth epitaxial layer being doped during growth to provide said one conductivity type, and to provide a resistivity of at least 0.5 ohm-centimeter. An impurity is then selectively diffused in the fourth layer to form a second diffused region of said opposite conductivity type having substantially the same geometry as said first diffused region of said opposite conductivity type.

During the various successive stages of epitaxial growth and selective diffusion, the thickness and resistivity of each epi layer are controlled and coordinated with diffusion time and diffusion surface concentration of dopant to ensure a merging of said first and second diffused regions of one conductivity type, and a merging of said first and second diffused regions of opposite conductivity type to form a low series resistance path from the surface of the fourth epitaxial layer to the back of the substrate and to form one continuous diffused channel region surrounding a portion of said fourth epitaxial layer wherein at least one circuit component is to be fabricated in the ultimate design of an integrated circuit, respectively.

DRAWINGS

Figure 1:
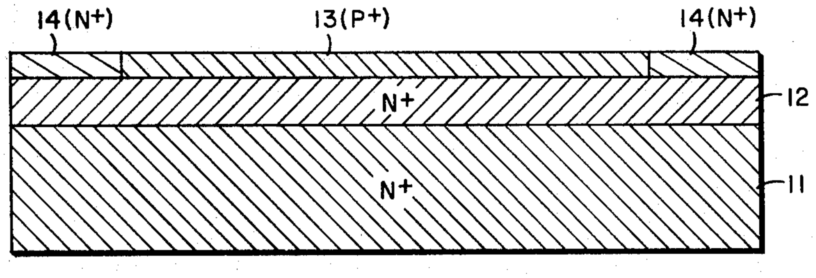
FIGS. 1 and 2 are greatly enlarged cross-sectional views of a semiconductor structure, illustrating intermediate stages in a method for fabrication of the monolithic silicon substructure of the invention.

Referring to FIG. 1, the process of the invention begins with the step of providing substrate 11 of monocrystalline silicon doped with phosphorus to provide a resistivity of about 0.002 ohm-centimeter. A first epitaxial layer 12 is deposited on substrate 11, with arsenic doping to provide a layer 12 to 15 microns thick and having a resistivity of 0.01 ohm-centimeter. A second epitaxial layer 13 is then deposited upon layer 12, with boron doping to provide a layer approximately 2 microns thick and containing $10^{19}$ atoms or boron per cc. During the growth of layer 13, the arsenic contained in layer 12 remains substantially immobile, whereby a step junction of exceptional abruptness is formed between layers 12 and 13, thereby providing maximum capacitance. At the same time there is a substantial diffusion of phosphorus from layer 11 into layer 12, further reducing the resistivity of layer 12. A masking $SiO_2$ layer is provided to facilitate the subsequent selective diffusion.

After completion of layer 13, a diffused collar region 14 is formed by the selective diffusion of phosphorus into layer 13, using known techniques. The exact depth of diffusion is not critical; however, a low resistance path must be formed between the surface and layer 11. For convenience, the diffusion band is shown to have a depth concident with the junction between layers 12 and 13. A doping concentration is provided in band 14 sufficient to lower the resistivity below about 0.005 ohm-centimeter.

Figure 2:
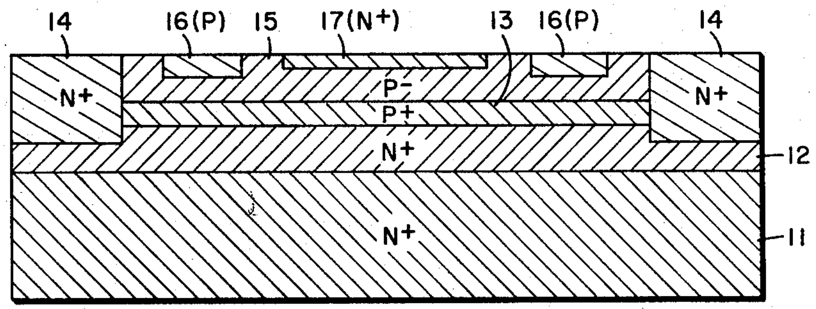

The next step, as shown in FIG. 2, is the formation of a third epitaxial layer 15, grown to a thickness of about 10 microns and provided with about $1\times15$ atoms of boron per cc. During the formation of layer 15, diffusion of phosphorus occurs adjacent collar region 14 whereby said region is inherently extended through a portion of layer 15. A masking $SiO_2$ layer is provided to facilitate the subsequent selective diffusions. After completion of layer 15, selective diffusion of additional phosphorus dopant is necessary to further extend region 14 to the surface of layer 15. In a separate diffusion step, a boron-doped channel 16 is formed, thereby initiating the formation of an isolation channel to be extended into a subsequently grown epitaxial layer wherein the active components of the ultimate structure are to be fabricated. A separate selective diffusion step is also required to provide an arsenic doped buried layer 17 for the purpose of decreasing collector series resistance of transistors to be fabricated in a subsequent layer. A concentration or arsenic is provided sufficient to lower the resistivity below about 0.008 ohm-centimeter.

Figure 3:
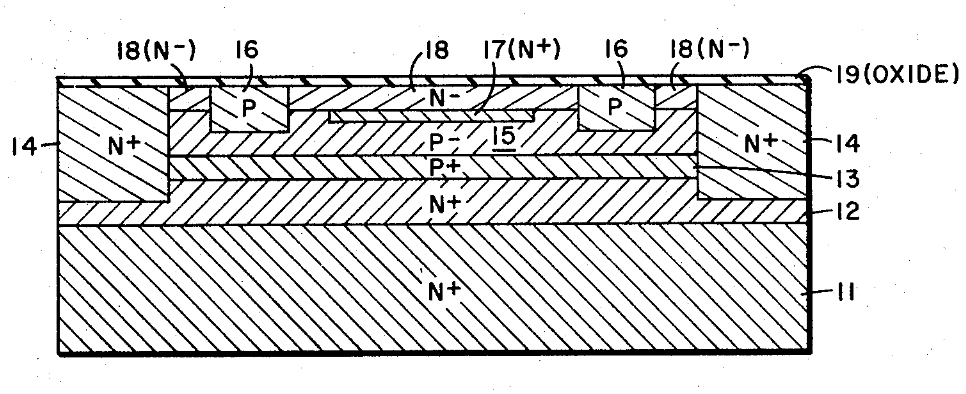
FIG. 3 is a greatly enlarged cross-sectional view of the completed substructure of the invention.

Thereafter, as shown in FIG. 3, a fourth epitaxial layer 18 is deposited on layer 15 to provide 2 microns of 0.5–1.0 ohm-centimeters arsenic-doped silicon. During the growth of layer 18, diffusion from channel 16 and collar region 14 provides an extension of these regions through the entire thickness of layer 18 as shown in the drawing. Finally, a passivating layer 19 of silicon dioxide is deposited on layer 18.

In addition to the primary advantage of high decoupling capacitance between layers 12 and 13, the structure of the invention provides reduced collar resistance due at least partly to lower substrate resistivity; and reduced collector-substrate capacitance due at least partly to the high resistivity of layer 15.

We claim:

1. A monolithic silicon substructure for use in the fabrication of an integrated circuit comprising:

(a) a silicon substrate of one conductivity type heavily doped to provide a resistivity of less than 0.005 ohm-centimeter;

(b) a first epitaxial silicon layer of the same conductivity type on said substrate, heavily doped with an impurity having a substantially lower diffusivity in silicon than that of the dopant of said substrate;

(c) a second epitaxial silicon layer of opposite conductivity type on said first epitaxial layer, heavily doped to provide a resistivity less than 0.05 ohm-centimeter;

(d) a third epitaxial silicon layer of said opposite conductivity type on said second epitaxial layer, lightly doped to provide a substantially higher resistivity than said second epitaxial layer;

(e) a fourth epitaxial silicon layer of said one conductivity type, on said third epitaxial layer, lightly doped to provide a relatively high resistivity;

(f) a first diffused region of said one conductivity type heavily doped to provide a low resistivity path extending through said second, third, and fourth epitaxial layers and at least partially through said first epitaxial layer;

(g) a second difffused region of said opposite conductivity type extending through the fourth epitaxial layer and at least partially through said third epitaxial layer, electrically isolating a portion of said fourth epitaxial layer wherein one or more circuit components are to be fabricated in the ultimate design of an integrated circuit.

2. A substructure as defined in claim 1 further including a low resistivity region of said one conductivity type diffused into the surface of said third epitaxial layer, just below the said isolated portion of the fourth epi layer, and spaced from said second diffused region of said opposite conductivity type.

3. A substructure as defined by claim 1 wherein said substrate layer is doped with phosphorus, and said first epitaxial layer is doped with arsenic or antimony.

4. A method for constructing a monolithic silicon substructure for use in the fabrication of an integrated circuit having a high density of circuit components comprising:

(a) providing a monocrystalline silicon substrate doped with a first impurity of one conductivity type to provide a substrate resistivity of less than 0.008 ohm-centimeter;

(b) growing a first epitaxial silicon layer thereon of the same conductivity type having a thickness of at least 8 microns and doped with a second impurity having a substantially lower diffusivity in silicon than the diffusivity of said first impurity;

(c) growing a second epitaxial silicon layer at least 1 micron thick on said first epitaxial layer, said second layer being doped with a third impurity during growth to provide a conductivity type opposite that of said substrate and first epitaxial layer, and to provide a resistivity of less than 0.05 ohm-centimeter;

(d) selectively diffusing an impurity into said second epitaxial layer to form a first collar region of said one conductivity type having a resistivity of less than 0.008 ohm-centimeter;

(e) growing a third epitaxial silicon layer of at least 8 microns thickness on said second epitaxial layer, said third layer being lightly doped during growth to provide the same conductivity type as said second layer, and to provide a substantially greater resistivity than that of said second layer;

(f) selectively diffusing an impurity into said third epitaxal layer to form a second collar region of said one conductivity type having a resistivity of less than 0.008 ohmcentimeter and having substantially the same geometric pattern as said first collar region;

(g) selectively diffusing an impurity into said third layer to form a first diffused region of said opposite conductivity type surrounding a portion of said third layer;

(h) growing a third epitaxial layer at least 1 micron thick on said third layer, said fourth layer being doped during growth to provide said one conductivity type, and to provide a resistivity of at least 0.5 ohm-centimeter;

(i) selectively diffusing an impurity into said fourth layer to form a third collar region of said one conductivity type having a resistivity of less than 0.008 ohm-centimeter and having substantially the same geometry as said first and second collar region;

(j) selectively diffusing an impurity into said fourth layer to form a second diffused region of said opposite conductivity type having substantially the same geometry as said first diffused region of opposite conductivity type; and (k) maintaining conditions of epitaxial growth during steps (d), (e), and (h) coordinated with diffusion depth during steps (c), (f), (g), and (j) such that said first, second, and third collar regions are merged to form a single collar region, and said first and second diffused regions of opposite conductivity type are merged to form a single diffused channel region surrounding a portion of said fourth epitaxial layer wherein at least one circuit component is to be fabricated in accordance with the ultimate design of an integrated circuit.

5. A method as defined in claim 4 wherein said first impurity is phosphorus and said second impurity is arsenic or antimony.

6. A method as defined in claim 4 including the step of selectively diffusing a low resistivity region of said one conductivity type within a surface portion of said third epitaxial region only within the area of said third epitaxial region surrounded by said first diffused region of said opposite conductivity type.

References Cited

UNITED STATES PATENTS

| | | | |
|---|---|---|---|
| 3,423,653 | 1/1969 | Chang | 317—235 |
| 3,423,650 | 1/1969 | Cohen | 317—234 |
| 3,404,450 | 10/1968 | Karcher | 29—577 |
| 3,370,995 | 2/1968 | Lowery | 148—175 |
| 3,460,006 | 8/1969 | Strull | 317—235 |
| 3,327,182 | 6/1967 | Kisinko | 317—235 |
| 3,260,902 | 7/1966 | Porter | 317—235 |

OTHER REFERENCES

JOHN W. HUCKERT, Primary Examiner
M. H. EDLOW, Assistant Examiner

U.S. Cl. X.R.

148—175, 186; 317—234